United States Patent
Wallace et al.

(10) Patent No.: US 12,213,263 B2
(45) Date of Patent: Jan. 28, 2025

(54) DISPLAY CAMERA SYSTEM

(71) Applicant: Lenovo (Singapore) Pte. Ltd., Singapore (SG)

(72) Inventors: Brian William Wallace, Raleigh, NC (US); Cuong Truong, Cary, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 348 days.

(21) Appl. No.: 17/402,917

(22) Filed: Aug. 16, 2021

(65) Prior Publication Data

US 2023/0047594 A1    Feb. 16, 2023

(51) Int. Cl.
*H05K 5/02* (2006.01)
*G03B 17/56* (2021.01)
*H05K 5/00* (2006.01)

(52) U.S. Cl.
CPC ......... *H05K 5/0204* (2013.01); *G03B 17/561* (2013.01); *H05K 5/0017* (2013.01)

(58) Field of Classification Search
CPC .... G03B 11/043; G03B 17/02; G03B 17/561; G06F 1/1605; G06F 1/1607; H04N 23/57; H05K 5/0017; H05K 5/0204
See application file for complete search history.

(56) References Cited

U.S. PATENT DOCUMENTS

| | | | |
|---|---|---|---|
| 9,369,170 B2* | 6/2016 | Sorrentino | H04B 1/3888 |
| 11,435,781 B1* | 9/2022 | Smith | G06F 1/3287 |
| 2005/0014527 A1* | 1/2005 | Chambers | H04M 1/0264 |
| | | | 348/E7.079 |
| 2013/0088639 A1* | 4/2013 | Mundt | G03B 11/043 |
| | | | 348/372 |
| 2016/0077670 A1* | 3/2016 | Short | G06F 3/167 |
| | | | 345/175 |
| 2019/0364178 A1* | 11/2019 | Tsai | G03B 17/04 |
| 2019/0373214 A1* | 12/2019 | Gurr | H04N 23/62 |
| 2021/0365671 A1* | 11/2021 | Jiang | G06F 1/1637 |

* cited by examiner

*Primary Examiner* — Antoinette T Spinks
(74) *Attorney, Agent, or Firm* — Brian J. Pangrle

(57) ABSTRACT

A system can include a display assembly that includes a display, a display side, a back side and a frame, where the frame includes frame magnetic material and a frame electronic interface; and a camera assembly that includes a housing, a camera and a tilt mount, where the tilt mount includes mount magnetic material and a mount electronic interface that electronically mates with the frame electronic interface via a magnetic attraction force.

20 Claims, 9 Drawing Sheets

DISPLAY CAMERA SYSTEM

TECHNICAL FIELD

Subject matter disclosed herein generally relates to cameras for computing and display devices.

BACKGROUND

A system can include a display assembly with a display where, for purposes of person-to-person communications, the system can include a camera such as a web cam.

SUMMARY

A system can include a display assembly that includes a display, a display side, a back side and a frame, where the frame includes frame magnetic material and a frame electronic interface; and a camera assembly that includes a housing, a camera and a tilt mount, where the tilt mount includes mount magnetic material and a mount electronic interface that electronically mates with the frame electronic interface via a magnetic attraction force. A camera assembly can include a housing; a camera disposed in the housing; and a tilt mount, where the tilt mount includes mount magnetic material and a mount electronic interface. Various other apparatuses, assemblies, systems, methods, etc., are also disclosed.

BRIEF DESCRIPTION OF THE DRAWINGS

Features and advantages of the described implementations can be more readily understood by reference to the following description taken in conjunction with examples of the accompanying drawings.

DETAILED DESCRIPTION

The following description includes the best mode presently contemplated for practicing the described implementations. This description is not to be taken in a limiting sense, but rather is made merely for the purpose of describing the general principles of the implementations. The scope of the invention should be ascertained with reference to the issued claims.

Figure 1:
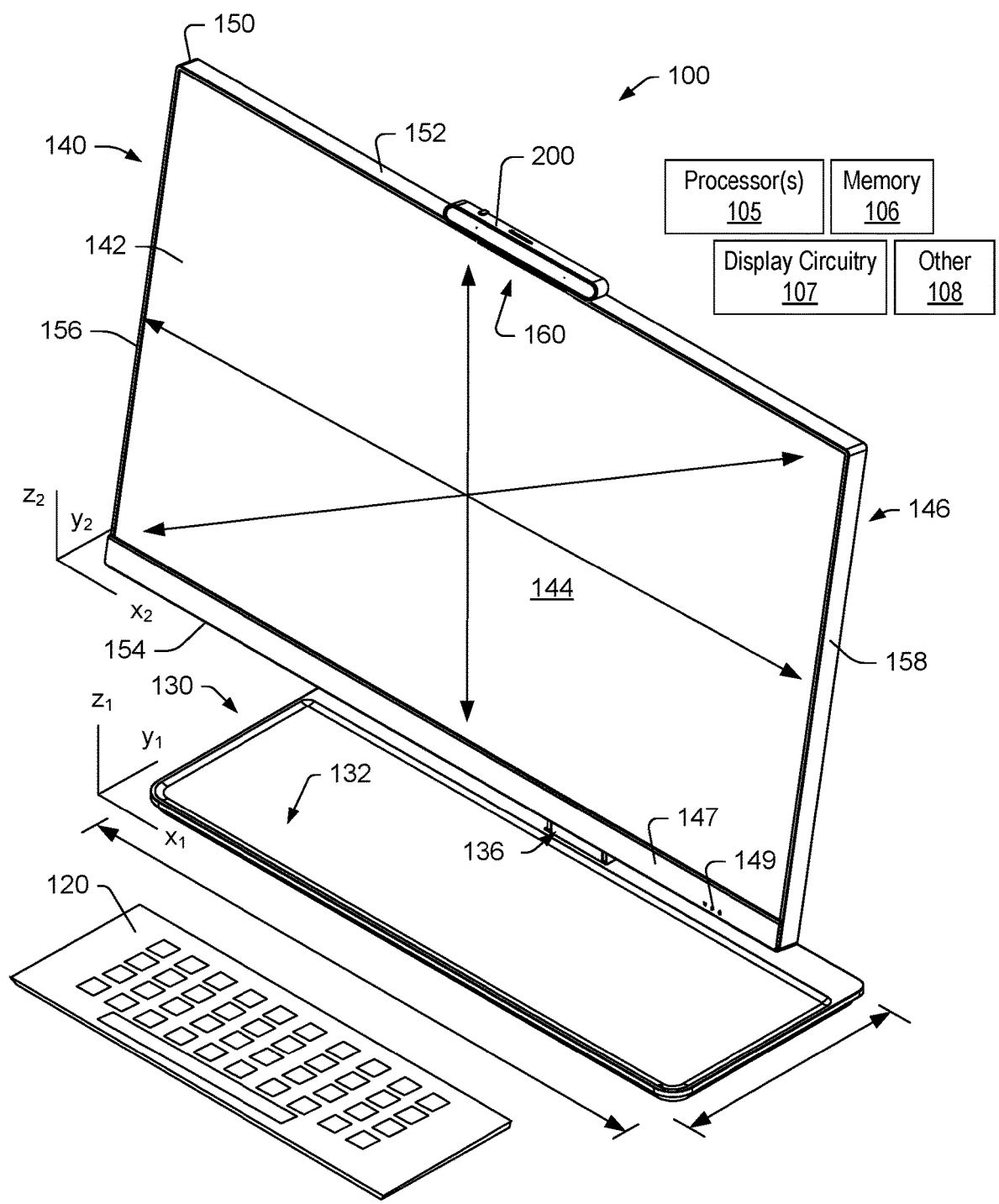
FIG. 1 is a perspective view of an example of a system.

FIG. 1 shows an example of a system 100 that can include one or more processors 105, memory 106 accessible to at least one of the one or more processors 105, display circuitry 107 and one or more other components 108, which can include electronic circuitry, instructions stored in the memory 106 and executable by at least one of the one or more processors 105, etc.

As shown in FIG. 1, the system 100 includes a display assembly 140 with a display 142 that may utilize one or more technologies (e.g., LED, LCD, etc.). The display assembly 140 can include a display side 144, a back side 146 and a frame 150 where the frame 150 can include an interface 160 for a camera assembly 200. The display circuitry 107 can be operatively coupled to at least one of the one or more processors 105, for example, to receive data, instructions, etc., for rendering text, graphics, images, etc., to the display side 144 of the display 142.

In the example of FIG. 1, the interface 160 can include frame magnetic material and a frame electronic interface for the camera assembly 200. For example, the camera assembly 200 can include magnetic material and an electronic interface that can couple to the frame 150 via the frame magnetic material and the frame electronic interface. For example, the camera magnetic material and the frame magnetic material can generate a magnetic attraction force that can provide for coupling of the frame electronic interface and the camera electronic interface. Such a magnetic attraction force may help to assure appropriate coupling for purposes of data and/or power transmission. As an example, one or more of the electronic interfaces may include resilient contacts where a magnetic attraction force can cause elastic deformation such that robust electrical connections are established for purposes of data and/or power transmission via the electronic interfaces.

As an example, a resilient contact may be a spring-loaded pin type of contact as a type of electrical connector. A resilient contact may be robust via resilience that helps to diminish effects of mechanical shock and vibration.

A particular type of resilient contact can be a pogo pin, which may include an integrated spring that can apply a force to a mating interface (e.g., receptacle, contact plate, etc.). Such a force may help to reduce risk of intermittent electrical connection (e.g., due to vibration, shock, etc.). As to types of springs that may be employed in a resilient contact, consider a helical spring, a cantilever spring, or other type of spring.

As an example, an electronic interface may include a target, which may be a conductive land. A target may be flat, curved, etc., and static (e.g., may be without moving parts). A target may be non-resilient such that elastic deformation does not occur, for example, when contacted. As an example, a target may be resilient and apply a biasing force against another resilient component (e.g., a pogo pin, etc.).

As an example, the display circuitry 107 can include one or more graphics processing units (GPUs) and, for example, one or more of the one or more processors 105 can be a central processing unit (CPU). As an example, the display circuitry 107 can include input circuitry such as touch circuitry, digitizer circuitry, etc., such that the display side 144 is an input surface. For example, the display side 144 may receive input via touch, a stylus, etc. As an example, the display assembly 140 can include a touchscreen display where a finger, a stylus, etc., can be utilized; noting sensing as to input may occur with or without physical contact between a finger and the display side 144, between a stylus and the display side 144, etc., depending on the type of input circuitry utilized (e.g., resistive, capacitive, acoustic wave, infrared, optical, dispersive signal, etc.).

In the example of FIG. 1, the system 100 can include a base 130 that includes an upper surface 132 and an arm 136 that is operatively coupled to the display assembly 140. For example, the arm 136 can extend from the base 130 where the display assembly 140 includes an arm mount that couples the arm 136 to the display assembly 140, for example, on the back side 142 of the display assembly 140 that is opposite the display side 144 of the display assembly 140. As an example, the base 130 and the arm 136 can be a stand for the display assembly 140.

As shown in the example of FIG. 1, the display side 144 may be centered along a centerline of the system 100 and may be disposed at an angle that can be defined by the base 130 or a flat support surface such as a desktop, a tabletop, a countertop, etc., where the base 130 or the flat support surface can be planar and horizontal. As shown, the arm 136 rises from the base 130 at an angle that may be normal to the base 130 or the flat support surface (e.g., a 90 degree angle). As to an angle of the display side 144, it may be 90 degrees, greater than 90 degrees or less than 90 degrees.

The display side 144 can be part of the display 142 that includes or is operatively coupled to the display circuitry 107, which may include one or more types of touch, digitizer, etc., circuitry. As shown, the base 130 and the display assembly 140 and/or the display side 144 can be defined with respect to one or more coordinate systems such as, for example, one or more Cartesian coordinate systems (see, e.g., $x_1, y_1, z_1$ and $x_2, y_2, z_2$). As shown, the display side 144 can be defined by a display area, which may be two-dimensional for a substantially flat (e.g., planar) display surface or which may be three-dimensional for a curved display surface, noting that such a curve may be of a relatively large radius of curvature (e.g., 50 cm or more) that gives the display a gentle curve (e.g., consider a radius of approximately the length of an extended arm of a user as traced by movement left and right from a shoulder of a user positioned in front of the display surface by an ergonomic distance). As shown, the arm 136 of the base 130 can be utilized to provide a gap or clearance between a lower edge of the display assembly 140 and a support surface on which the base 130 is supported (e.g., a desktop, tabletop, countertop, etc.). Such a gap may provide for rotation of the display 142 (e.g., from a landscape orientation to a portrait orientation).

In the example of FIG. 1, the frame 150 can include edges 152, 154, 156 and 158 where the edges 152 and 154 are long edges and where the edges 156 and 158 are short edges. For example, the frame 150 can be substantially rectangular (e.g., a rectangular form factor) and planar or rectangular and curved. The frame 150 may include a landscape orientation as shown in FIG. 1 where the long edges 152 and 154 are substantially horizontal and a portrait orientation where the long edges 152 and 154 are rotated by approximately 90 degrees to be substantially vertical. The ability to transition from one orientation to the other may provide a user with options that can be ergonomic, content dependent, etc. In the example of FIG. 1, the system 100 can include features that provide for transitioning the frame 150 between portrait and landscape orientations.

As an example, the display assembly 140 may include a bezel or bezels that occupy a portion of the front side (e.g., the display side 144) or the display assembly 140 may be substantially bezel-less or completely bezel-less. In the example of FIG. 1, the display assembly 140 is substantially bezel-less where a lower bezel 147 may be included, optionally with one or more features 149 (e.g., switches, touch controls, indicator lights, etc.). A bezel-less display assembly can provide for a display surface dimensions that are approximately the same as frame dimensions. As an example, where a frame edge thickness is visible from a display side, the frame edge thickness may be less than approximately 0.5 cm in thickness and considered part of a substantially bezel-less approach. Where a display extends to an edge, where a frame edge thickness is not visible, such an approach can be considered part of a bezel-less approach. Bezel and bezel-less can be defined with respect to active display area as, in some display assemblies, a bezel may be internal, being disposed beneath a cover glass.

Where a display assembly is bezel-less, space does not exist for a bezel integrated front facing camera. And where a display assembly includes a bezel along at least one edge, integration of a front facing camera into a bezel region takes space and may dictate the size of the bezel and hence a ratio of display assembly area to active display area. In some instances, a camera-less display assembly may be desirable. And, where a camera is not desired, it may be easier to manufacture a display assembly that is a bezel-less.

In the example of FIG. 1, the display assembly 140 and the camera assembly 200 may be part of a kit where a user can couple the camera assembly 200 to the display assembly 140 or not. In some instances, where de-coupling is too easy, the camera assembly 200 may be amenable to being readily de-coupled from a display assembly and carried away, for example, by a passer-by. As an example, a kit can include a balance of features that can provide for user options. For example, consider features that make de-coupling a little more complicated or inconvenient and other features that can include a mechanical shutter that can be positioned over an aperture of a camera (e.g., to block the camera's field of view (FOV)). In such an example, the camera assembly can be coupled to the display assembly and shuttered as desired or not coupled to the display, though with a risk of being misplaced, carried away, etc.

As an example, a kit may include a stand where a camera assembly can be coupled to a display assembly or to the stand. In such an example, the stand may or may not include a cable such as, for example, a USB cable such that the camera assembly can be electronically coupled to another device (e.g., a computing device, etc.) for purposes of data and/or power transmission.

In the example of FIG. 1, the camera assembly 200 is positioned on the frame 150, along the long edge 152. As an example, the display assembly 140 may include another interface, for example, consider an interface along one of the edges 156 and 158. In such an approach, the display assembly 140 may be rotated to a desired orientation and the camera assembly 200 coupled thereto along a top edge of the display assembly 140.

A position of the camera assembly 200 can be defined, for example, using one or more of the coordinate systems shown in FIG. 1. For example, a height of the camera assembly 200 can be determined using coordinates of the coordinate system $x_2, y_2,$ and $z_2$ with reference to coordinates of the coordinate system $x_1, y_1,$ and $z_1$ or, for example, the height of the camera assembly 200 may be defined with respect to the coordinate system $x_1, y_1,$ and $z_1$ alone (e.g., a height along $z_1$). Appropriate coordinates of either or both of the coordinate systems may be utilized for a landscape orientation or a portrait orientation of the display assembly 140.

As an example, the camera assembly 200 can include one or more cameras that may individually or collectively define a field of view (FOV). For optical elements, cameras, etc., the field of view (FOV) can be defined by a solid angle through which electromagnetic radiation can be received. In photography, the field of view is that part of the world that is visible through a camera at a particular position and orientation in space; objects outside a FOV when an image is captured are not recorded in the image. In photography, FOV may be expressed as an angular size of a view cone, as an angle of view. For a normal lens, the diagonal field of view can be calculated FOV=2 arctan(SensorSize/2f), where f is focal length.

An angle of view can differ from an angle of coverage, which describes the angle range that a lens can image. An image circle produced by a lens or optical element assembly can be configured to be large enough to cover a photosensor, for example, with no or minimal vignetting toward edges. If the angle of coverage of the lens does not fill the photosensor, the image circle will be visible, with strong vignetting toward the edges, and the effective angle of view can be limited to the angle of coverage.

In the example of FIG. 1, the camera assembly 200 is positioned to provide a forward FOV such that a user of the system 100 can be imaged, for example, for purposes of videoconferencing. The camera assembly 200 can include an adjustable mount where, for example, a user positioned in front of the system 100 may be brought into the FOV of the camera assembly 200 via the adjustable mount. As an example, an adjustable mount may provide for rotation of the camera assembly 200, for example, to allow for a backward facing FOV. As an example, the camera assembly 200 may include multiple cameras, which may include one or more front facing cameras and one or more back facing cameras. In the example of FIG. 1, the camera assembly 200 can include features that provide for tilting, for example, tilting down or tilting up, which may provide for adjustments where the display side 144 is tilted down or tilted up. As an example, the camera assembly 200 may be tiltable and rotatable.

Figure 2A:
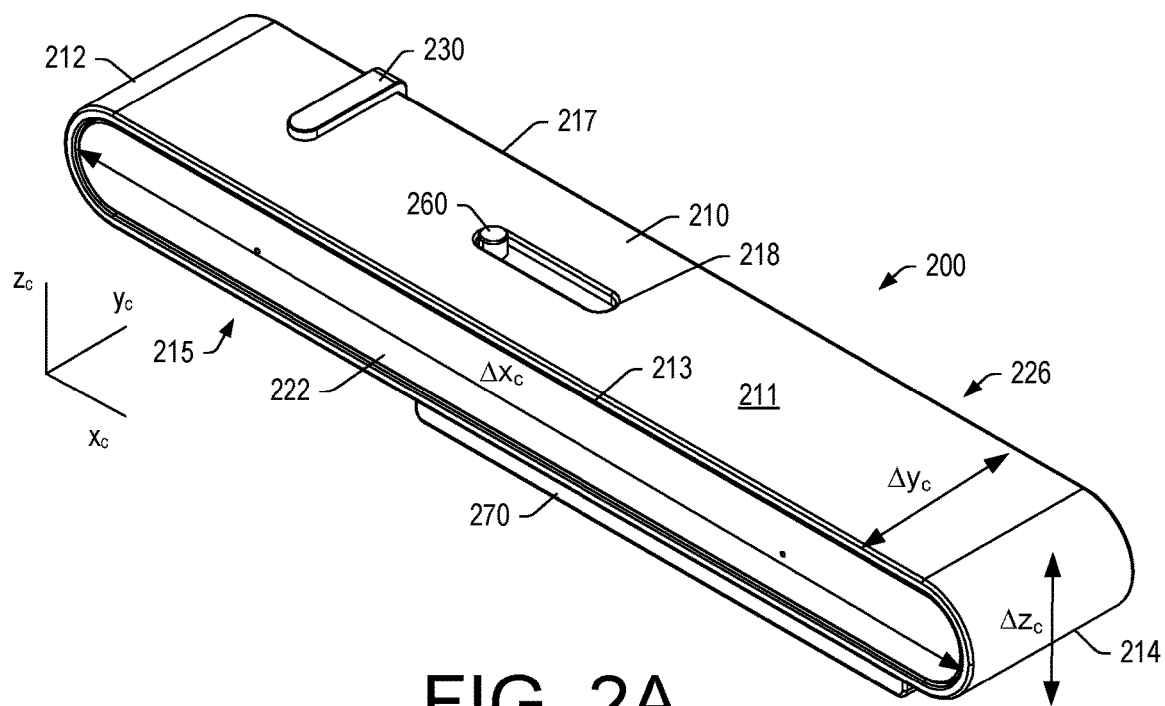
FIG. 2A and FIG. 2B are perspective views of an example of a camera assembly.
Figure 2B:
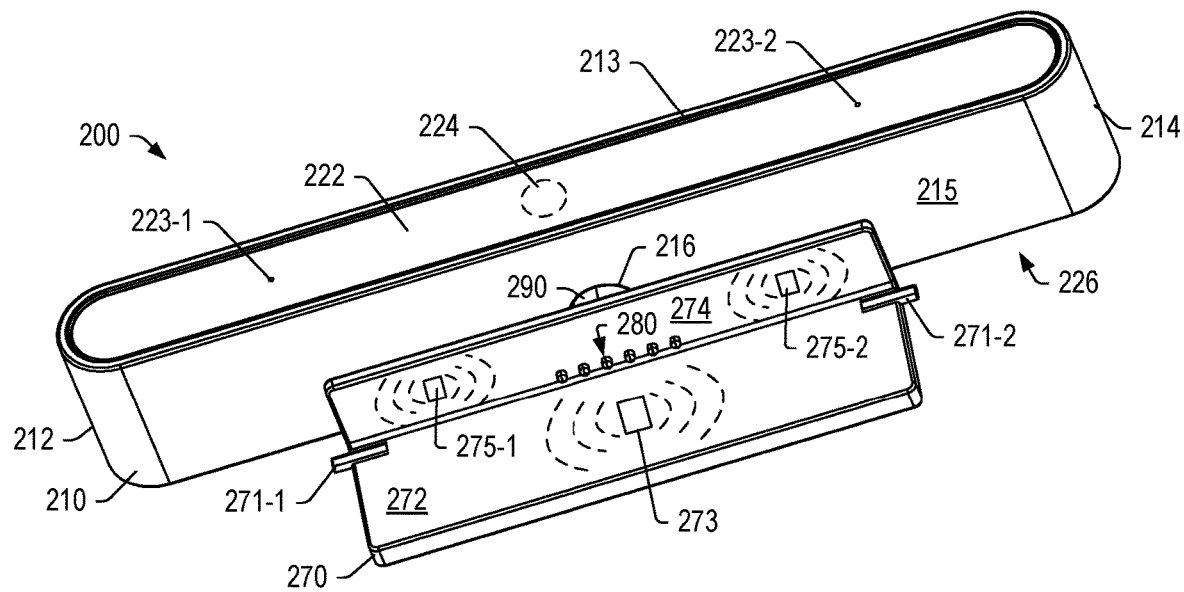

FIG. 2A and FIG. 2B show perspective views of an example of the camera assembly 200, where the perspective view of FIG. 2A includes a Cartesian coordinate system $x_c$, $y_c$ and $z_c$. One or more features of the camera assembly 200 may be defined with respect to a coordinate system or coordinate systems.

As shown in the example of FIG. 2A and FIG. 2B, the camera assembly 200 can include a housing 210 with a top side housing portion 211, a first side housing portion 212, a second side housing portion 214 and a bottom side housing portion 215 where the top side housing portion 211 and the bottom side housing portion 215 are opposing housing portions and wherein the first side housing portion 212 and the second side housing portion 214 are opposing housing portions. The housing 210 may be of a polygonal shape, a curved shape or a polygonal and curved shape (e.g., consider obround, etc.). As shown, the housing 210 can define a front side perimeter 213 and a back side perimeter 217 where the front side perimeter 213 can frame a front side 222 and the back side perimeter 217 can frame a back side 226. In the example of FIG. 2A and FIG. 2B, the housing 210 may be defined by a continuous surface such as a wraparound surface that extends between the front side perimeter 213 and the back side perimeter 217.

In the example of FIG. 2A and FIG. 2B, the housing 210 may be defined via an aspect ratio, for example, using the $x_c$ coordinate axis and the $z_c$ coordinate axis. As shown, the aspect ratio may be greater than approximately 2:1 (e.g., length $\Delta x_c$ along $x_c$ is at least twice the height $\Delta z_c$ along $z_c$). As an example, for a circular housing, an aspect ratio may be 1:1. A greater aspect ratio may provide for positioning an aperture of a camera of the camera assembly 200 closer to an edge of an active display area of a display assembly (e.g., consider a relatively slim camera assembly that may have a housing height $\Delta z_c$ less than approximately 3 cm and a housing length $\Delta x_c$ less than approximately 20 cm). As shown in FIG. 2A, the housing 210 can include a depth $\Delta y_c$ along $y_c$. As an example, the depth $\Delta y_c$ of the housing 210 may be less than approximately 10 cm and may be less than approximately 6 cm.

As mentioned, a camera assembly can include a mount. In the example of FIG. 2A and FIG. 2B, the camera assembly 200 includes a tilt mount 270 that is coupled to the housing 210 via an extension 290 as received via a socket 216. As shown, the tilt mount 270 can include an L-shape formed by two plates 272 and 274 that join at a corner. The tilt mount 270 can include one or more features 271-1 and 271-2 that can help to secure the camera assembly 200 to a display assembly. In the example of FIG. 2B, the features 271-1 and 271-2 are shown as extensions such as pegs that can mechanically couple the tilt mount 270 to a display assembly (e.g., via corresponding peg receptacles). As shown, the tilt mount 270 can include a mount electrical interface 280, which may include a series of electrical contacts such as, for example, resilient electrical contacts (e.g., pogo pins, etc.). As an example, a tilt mount may include features that provide for rotation and/or other movement in addition to tilting.

As shown in the example of FIG. 2A and FIG. 2B, the tilt mount 270 can include one or more mount magnetic materials 273, 275-1 and 275-2. A magnetic material can be a permanent magnet or a material that is attracted to a magnet such as, for example, a ferromagnetic material. Materials such as iron, nickel and cobalt become magnetized in a magnetic field and can retain some amount of magnetism when the field is removed. As an example, a display assembly may include one or more frame magnetic materials that can interact with one or more mount magnetic materials such that one or more magnetic attraction forces act to couple a camera assembly to a display assembly.

As mentioned, a magnetic attraction force may cause elastic deformation of a resilient electrical contact to enhance electrical connection in the presence of shock, vibration, etc. For example, consider one or more of the mount magnetic materials 273, 275-1 and 275-2 as being capable of generating magnetic attraction force(s) that can cause elastic deformation of one or more of the electrical contacts of the mount electrical interface 280.

As an example, the features 271-1 and 272-2 may provide for mechanical coupling to a display assembly with some amount of play where the amount of play provides for elastic deformation of one or more electrical contacts of the mount electrical interface 280. As an example, the features 271-1 and 272-2 may be seated in respective receptacles of a display assembly such that de-coupling of the camera assembly 200 demands multi-directional motion. For example, consider an upward motion in combination with a reward motion. Such a multi-directional motion approach can hinder quick de-coupling by a passer-by.

In the example of FIG. 2A and FIG. 2B, the camera assembly 200 includes a status light 230 and a mechanical shutter 260. As shown, the status light 230 extends from the top side housing portion 211 with an approximately 90 degree wraparound over the back side perimeter 217. In such an example, the status light 230 can be visible from at least the top side housing portion 211 and can be visible from the back side 226 of the camera assembly 200. Depending on various factors (e.g., the position of a user in front of a display assembly, the size and/or orientation of the display assembly, a tilt of the tilt mount 270, etc.), the status light 230 may not be visible. For example, the status light 230 can be set back a sufficient distance from the front side perimeter 213 such that a line-of-sight from a user's eyes does not connect directly to the status light 230. In such an example, emission of light from the status light 230 may not distract the user while the user is in a videoconference; however, a passer-by may be able to see emission of light from the status light 230 to understand that the user is busy (e.g., in a videoconference).

As shown in FIG. 2B, the front side 222 can include one or more openings 223-1 and 223-2 and/or one or more transparent portions 224. For example, the one or more openings 223-1 and 223-2 may be for receipt of sound waves where the camera assembly 200 includes one or more microphones and the one or more transparent portions 224 may be for a camera or cameras and, for example, to be able to see an indicator (e.g., a marker) when the mechanical shutter 260 is in a closed position via movement in a direction of a slot 218 in the top side housing portion 211. As an example, the front side 222 can include a glass material, a polymeric material, etc., that may include darkened portions (e.g., blacked out, etc.) and one or more transparent portions. As shown in the example of FIG. 2B, the transparent portion 224 is disposed between the openings 223-1 and 223-2 where the openings 223-1 and 223-2 may be for left and right microphones (e.g., consider stereo audio capture, etc.).

Figure 3A:
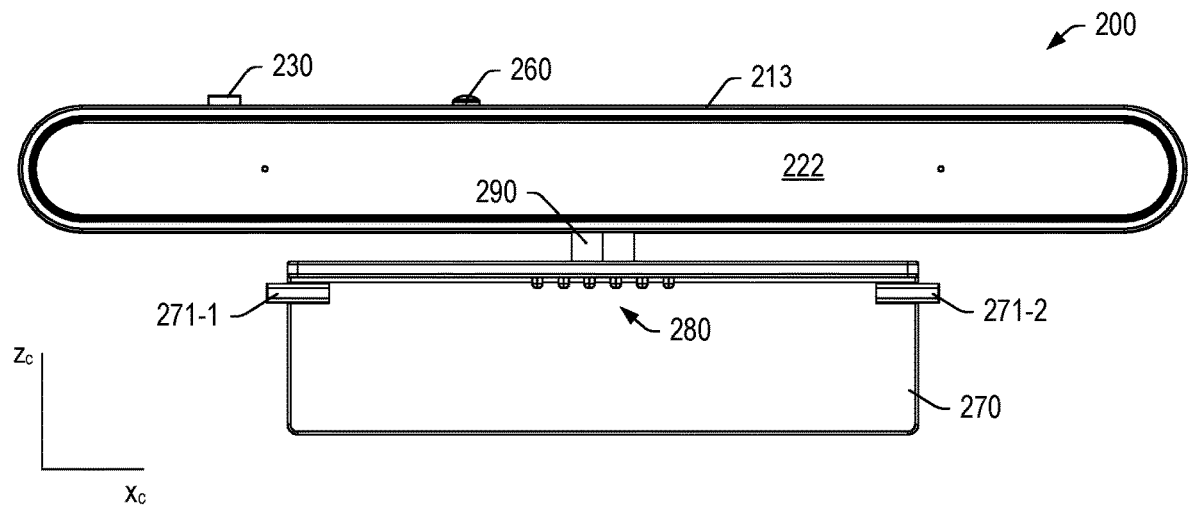
FIG. 3A and FIG. 3B are front and back views, respectively, of an example of a camera assembly.
Figure 3B:
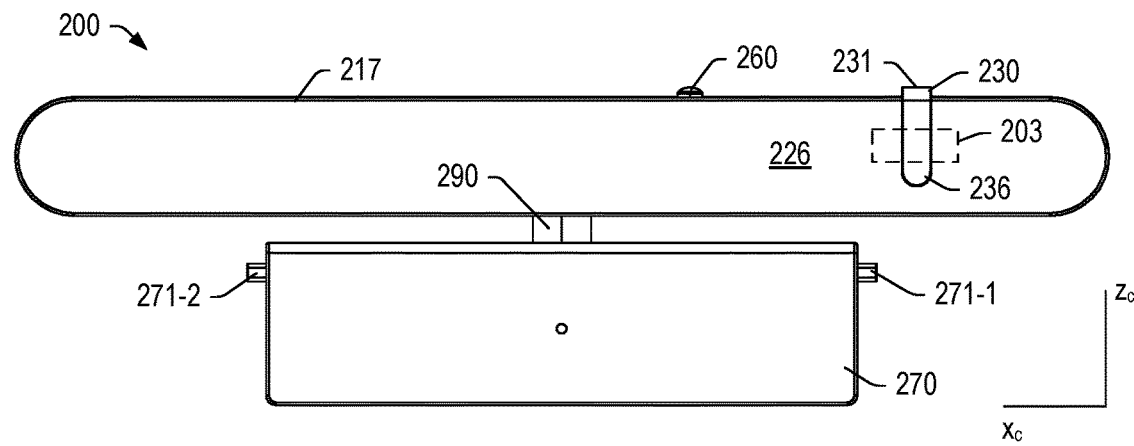

FIG. 3A and FIG. 3B show front side and back side views, respectively, of the camera assembly 200. As shown, the status light 230 is more visible in the back side view of FIG. 3B than in the front side view of FIG. 3A. As shown, the status light 230 can extend a distance down from the perimeter 217 to cover a portion of the back side 226. As an example, the status light 230 can be substantially L-shaped with a leg 231 that extends in a first direction and another leg 236 that extends in a second direction that is approximately orthogonal to the first direction (e.g. approximately 90 degrees, plus or minus 10 degrees). The camera assembly 200 can include illumination circuitry 203 that can include one or more light emitting diodes (LEDs) that can be actuated to emit light. As an example, a LED may emit red light or another color light. As an example, one or more of the legs 231 and 236 may be translucent and/or colored. For example, consider a red colored material that causes LED emission to be visible as a red light (e.g., a red status light). As an example, the illumination circuitry 203 can be electronically coupled to the mount electrical interface 280 such that signals and/or power can be received. For example, consider receiving a signal that indicates a videoconferencing session has commenced (e.g., using a videoconferencing application, etc.). In such an example, the signal can cause actuation of the status light 230 such that it emits visible light. When a videoconferencing session terminates, a signal may terminate and/or a termination signal may be received that causes de-actuation of the status light 230.

As an example, the mechanical shutter 260 may be utilized without interruption or change in status of the status light 230. In such an approach, a user may be in a conference using audio and not video when the mechanical shutter 260 is in a closed position (e.g., to physically cover an aperture of a camera, etc.). In such an example, the status light 230 can operate independent of the mechanical shutter 260.

Figure 4A:
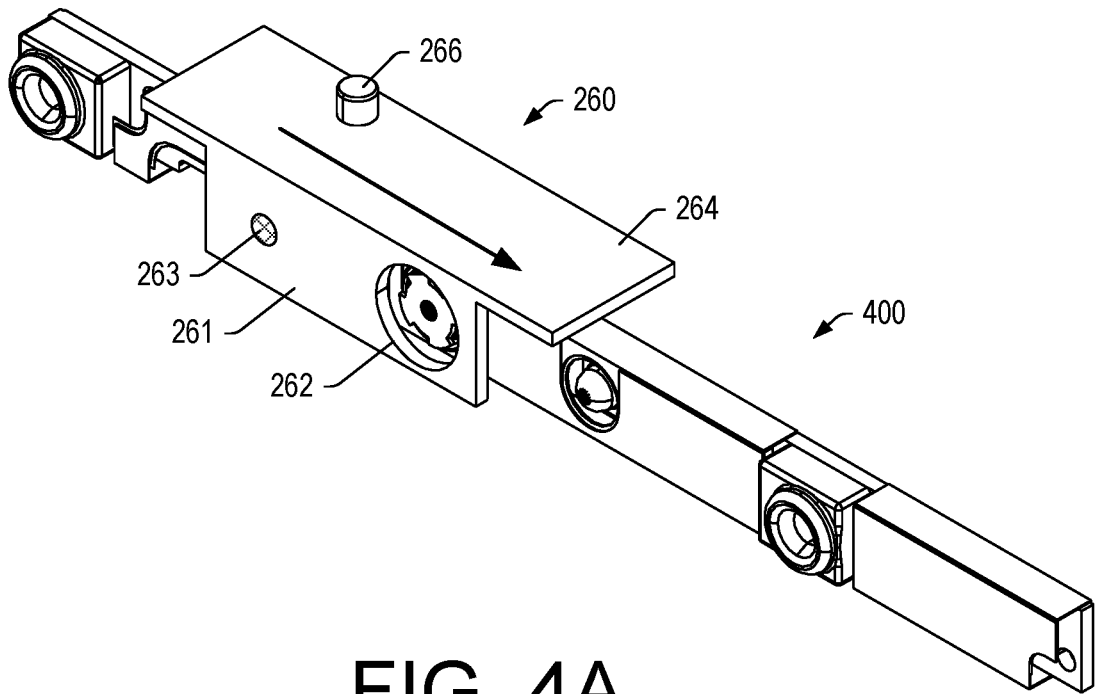
FIG. 4A and FIG. 4B are perspective view of an example of a media capture unit.
Figure 4B:
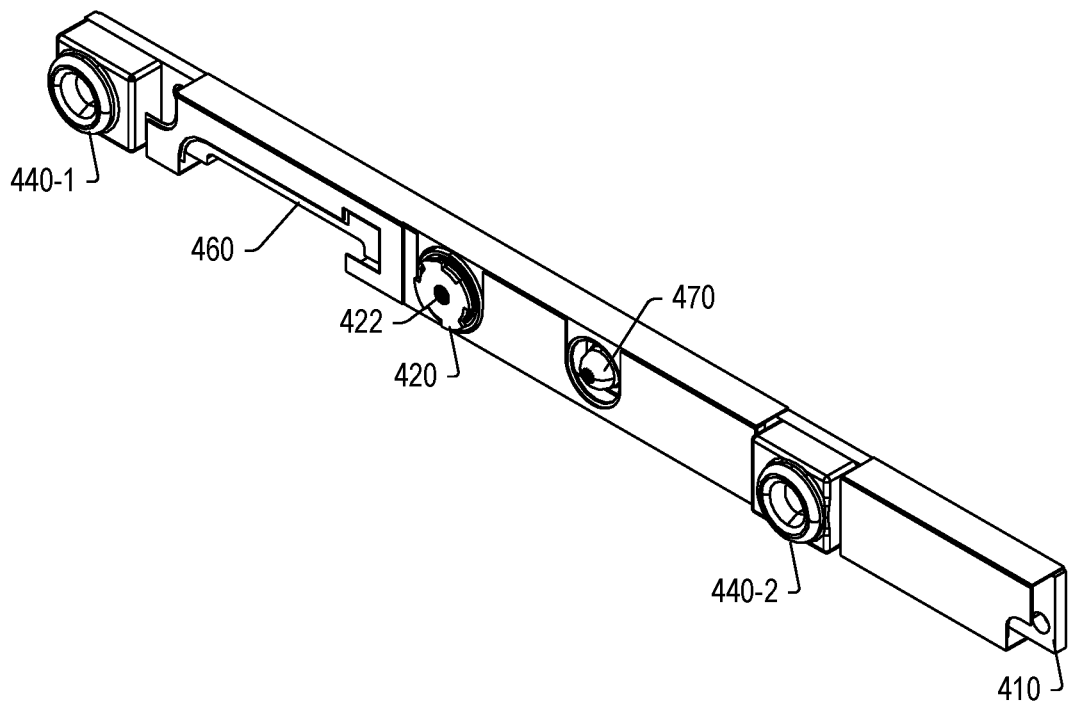

FIG. 4A and FIG. 4B show perspective views of examples of portions of the camera assembly 200. FIG. 4A shows the mechanical shutter 260 with respect to a media capture unit 400 that can be part of the camera assembly 200 and disposed within the housing 210 of the camera assembly 200. As shown in FIG. 4B, the media capture unit 400 can include circuitry 410, at least one visible light camera 420 with an aperture 422, one or more microphones 440-1 and 440-2, a mechanical shutter track 460 and an infrared camera 470. The mechanical shutter 260 may be translatable to physically cover the aperture 422 of the visible light camera 420.

As shown in FIG. 4A, the mechanical shutter 260 can include a front panel 261 with an opening 262 and a marker 263 (e.g., a colored marker such as a red marker) and a top panel 264 with an extension 266 that can be contacted by a finger of a user to move the mechanical shutter 260 from an open position to a closed position and vice versa.

The circuitry 410 can include video circuitry and/or audio circuitry and, for example, one or more other types of circuitry (e.g., autofocus, ambient light detection, etc.). The circuitry 410 can be electrically coupled to the mount electrical interface 280 of the camera assembly 200, for example, for purposes of data and/or power transmission. As an example, the circuitry 410 may include memory and/or one or more batteries. In such an example, the camera assembly 200 may be operable independent of a display assembly, for example, to capture images and/or audio with storage to the memory. In such an example, the memory may be accessible for purposes of downloading captured images and/or audio.

Figure 5:
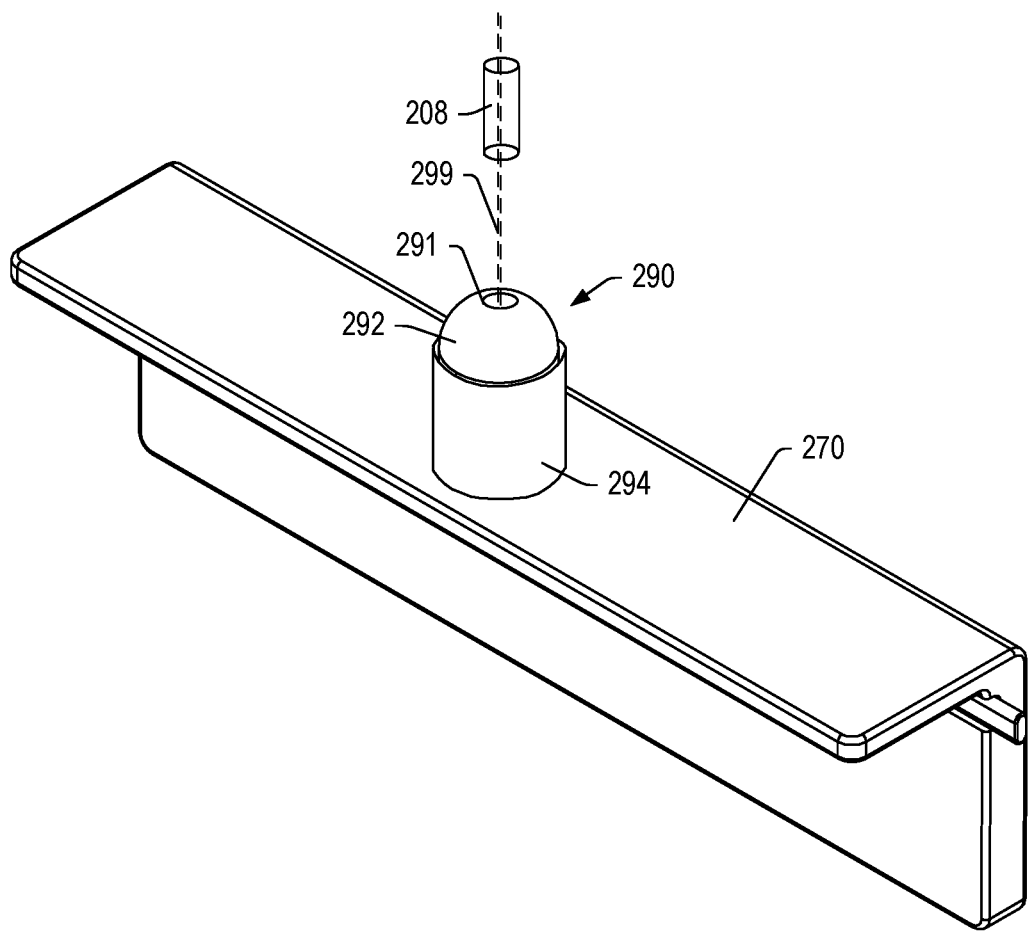
FIG. 5 is a perspective view of an example of a tilt mount.

FIG. 5 shows an example of the tilt mount 270 as including the extension 290, which can include an opening 291 for passage of one or more conductors 299 (e.g., one or more wires). The extension 290 can be part of a ball joint with a movable ball portion 292 received in a ball socket portion 294 where the ball joint can provide for at least tilting of the housing 210 on the tilt mount 270. For example, the housing 210 may include a hollow stem 208 that can be received by the opening 291 of the extension 290 to thereby mechanically couple the housing 210 to the tilt mount 270 (e.g., consider a threaded connection, a bayonet connection, etc.). In such an example, the one or more conductors 299 can provide for electronical connection of circuitry of the housing 210 (e.g., the status light circuitry 236, the circuitry 410, etc.) and electrical contacts of the mount electronic interface 280 where the one or more conductors 299 may be flexible to allow for tilting of the housing 210 without loss of conduction. In the example of FIG. 5, the hollow stem 208 may provide for movement of the housing 210 via the ball portion 292 as received in the ball socket portion 294. As explained, some amount of tilting can be provided and optionally some amount of rotation (e.g., to rotate the housing 210 to face forward or to face backward). In the example of FIG. 5, the hollow stem 208 can define an axis where the axis is movable via the ball joint.

As an example, a camera assembly may include a ball joint that includes a ball and a ball socket where the ball socket may be part of a housing of a camera head unit or may be part of a tilt mount. As an example, a camera assembly may include multiple ball joints, for example, consider a camera head unit with a ball socket that receives a ball and a tilt mount with a ball socket that receives another ball where the balls are coupled (e.g., via a shaft, etc.). As an example, a camera assembly may include a pin joint that defines an axis where a housing of the camera assembly can rotate about the axis, for example, to tilt the housing up or down if on a substantially horizontal edge or to tilt the housing left or right if on a substantially vertical edge. A pin joint can include one or more bores and one or more axles (e.g., one or more pins).

Figure 6:
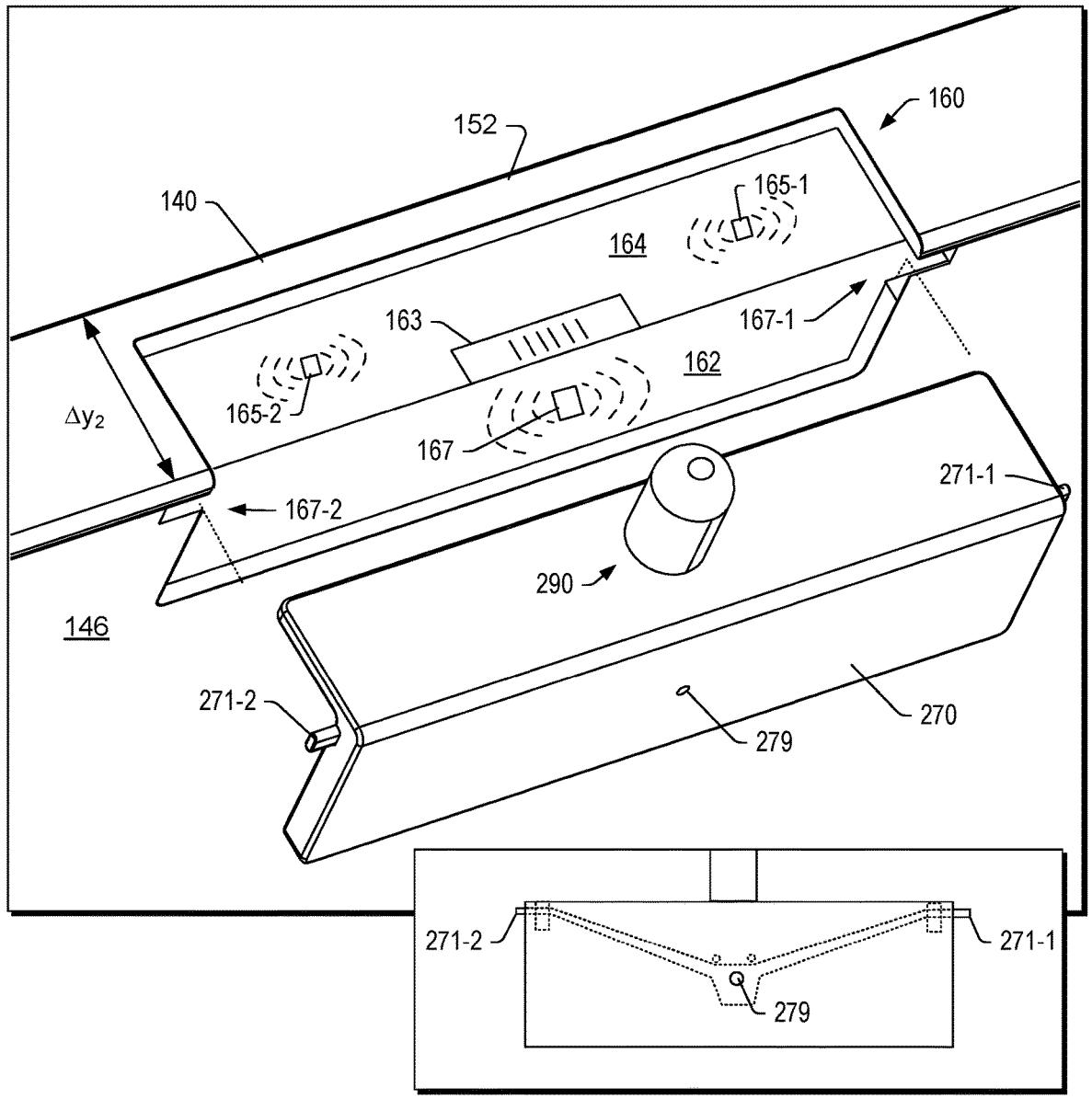
FIG. 6 is a perspective view of an example of a portion of a display assembly and an example of a tilt mount.

FIG. 6 shows a perspective view of an example of the display assembly 140 with respect to an example of the tilt mount 270. As shown, the display assembly 140 includes the interface 160, which includes frame magnetic material 165-1, 165-2 and 167 and a frame electronic interface 163 for the camera assembly 200. As mentioned, such an interface may be disposed along a short edge or a long edge of a display assembly with a rectangular form factor and, as an example, a display assembly may include multiple instances of such an interface.

As shown in the example of FIG. 6, the edge 152 of the frame 150 can be of a depth $\Delta y_2$ where at least a portion of the edge 152 can be cut-out or recessed. As explained, a display assembly may include one or more interfaces such as, for example, an interface along a long edge and an interface along a short edge.

In the example of FIG. 6, the interface 160 includes receptacles 167-1 and 167-2 that can receive the features 271-1 and 271-2, respectively. As shown, the features 271-1 and 271-2 (e.g., prongs, etc.) can be moved into the receptacles 167-1 and 167-2 in a first direction and then moved downwardly in a second direction, which may be aided by magnetic attraction force. In such an example, the tilt mount 270 is not easily de-coupled from the interface 160 of the display assembly 140 by a passer-by as the passer-by would have to know the series of movements to de-couple the tilt mount 270 and hence the camera assembly 200. Additionally, the features 271-1 and 271-2 may provide for an interference fit and/or click fit in the interface 160, which may increase the amount of force required for de-coupling. As explained, the camera assembly 200 and the display assembly 140 can include mating features that act as anti-theft features to reduce risk of a passer-by de-coupling the camera assembly 200 from the display assembly 140.

In the example of FIG. 6, the frame electronic interface 163 may include static electrical contacts (e.g., conductive metallic material, etc.). As explained, the mount electrical interface 280 can include resilient electrical contacts (e.g., pogo pins, etc.). Various features in the example of FIG. 6 (see also, e.g., FIG. 2A and FIG. 2B) can provide for robust electrical connection and theft deterrence.

In the example of FIG. 6, the tilt mount 270 can include a pin hole 279 that can be part of a pin hole mechanism that facilitates de-coupling of the tilt mount 270 from the display assembly 140. For example, an end of a paper clip or other suitable tool may be inserted into the pin hole 279 to cause retraction of at least one the features 271-1 and 271-2. For example, one or both of the features 271-1 and 272-2 can be part of a piece of resilient material where a tool can be inserted into the pin hole 279 to elastically deform the resilient material in a manner that causes one or both of the features 271-1 and 271-2 to retract or otherwise reduce force (e.g., as to an interference fit, a spring-like fit, etc.). As shown in an inset view in FIG. 6, the features 271-1 and 271-2 can be part of an integral piece of material set in various guides where pushing forward of the material causes the features 271-1 and 271-2 to move inwardly and retract. In such an example, the interface 160 may have receptacles 167-1 and 167-2 that are closed toward the outside (e.g., the back side 146).

As an example, in the instance that one or more of the features 271-1 and 271-2 breaks, the camera assembly 200 may still be suitably coupled to the display assembly 140 via magnetic attraction force. As an example, a mount such as the mount 270 may be suitable for attachment to a frame of a display assembly that does not include a recess where, for example, an electronic interface is exposed and cable of making an electrical connection with the mount electronic interface 280.

Figure 7:
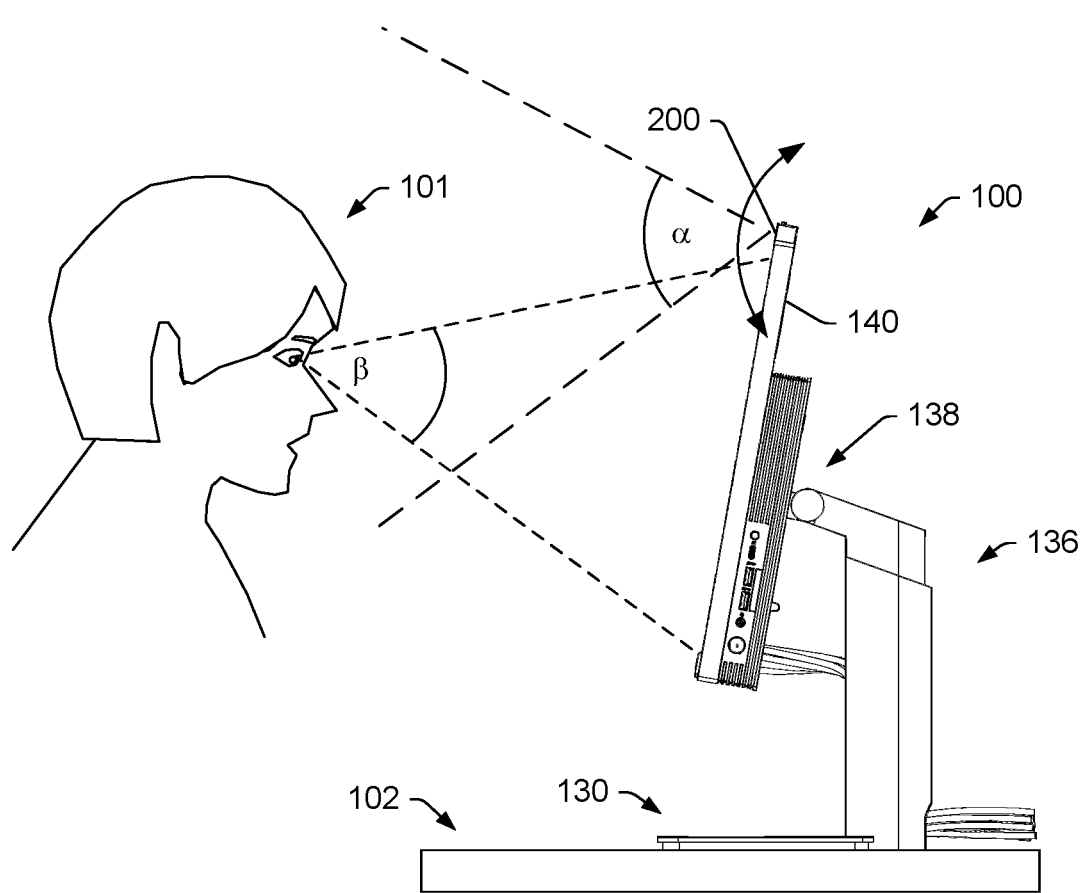
FIG. 7 is a series of diagrams of an example of a user and the system of FIG. 1 and an example of a captured image.
Figure 7:
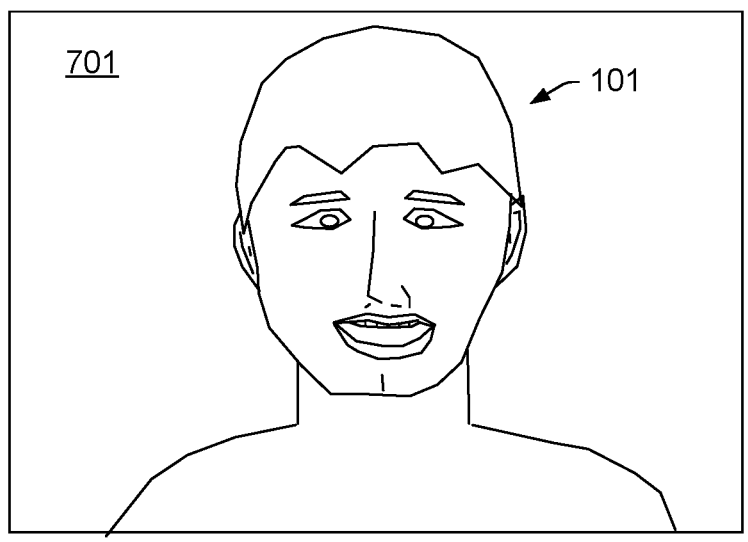

FIG. 7 shows an example of a user 101 positioned in front of the system 100 as supported on a surface 102 where the display assembly 140 is operatively coupled to the arm 136 of the base 130 via an arm mount 138 (e.g., an arm coupling, etc.). In such an example, the angle of a display surface of the display assembly 140 may be adjusted.

In the example of FIG. 7, the camera assembly 200 is shown as having an angle α with an origin at the camera assembly 200 (e.g., a camera aperture with a FOV) and the user 101 is shown as having an angle β with an origin or origins at the user's eye or eyes. As shown, the camera assembly 200 can capture an image 701 of the user 101. The image 701 may be transmitted via one or more networks to a remote device where the image 701 can be rendered to a display of the remote device or operatively coupled to the remote device. For example, one or more network interfaces of the system 100 can be operatively coupled to one or more networks to transmit image data of the image 701 (e.g., to a network address, etc.).

As an example, an optimal viewing angle for eyes may be defined according to the International Standards Organization (ISO ergonomics standards 9241-5). ISO 9241-5 states that an optimal viewing angle, or resting angle, is a −35 degree downward gaze angle from the horizon (e.g., at the level of the eyes). ISO 9241-5 also states that the optimal display placement is in a range of +/−15 degrees from the resting angle (e.g., −20 degrees to −50 degrees). Using the ISO 9241-5, a display surface may be optimally placed to be in a range of −20 degrees to −50 degrees relative to the horizon. The ISO 9241-5 range tends to be a bit lower than most users are accustomed for computer work, but is near a "normal" reading position as used by humans for many years. In this "normal" reading position, a display surface may be more appropriately called chest-height rather than head-height. As to specific upper and lower limits of ISO 9241-5, it allows for a 0 degree horizontal gaze down to a −60 degrees gaze angle; noting that the lower limit of −60 degree angle may result in some amount of neck strain.

Various standards as to viewing angles can be limited to display surfaces of a certain size. For example, as display area increases, for example, beyond an approximately 50 cm diagonal dimension, an optimal position can have the top of the display area at a level that is above eye level. For example, a display surface of the display assembly 140 of FIG. 7 can have a diagonal dimension that is greater than 50 cm (e.g., consider approximately 70 cm or more) such that an optimal viewing angle may differ from that specified by a standard.

In the example of FIG. 7, the user may adjust the camera assembly 200, for example, via tilting, to provide for a suitable capture of the user's face. As mentioned, the system 100 may provide for rotation of the display assembly 140 where, for example, the arm mount 138 includes a turntable. In such an example, the camera assembly 200 may be utilized from a substantially vertical edge in a portrait orientation of the display assembly 140 and from a substantially horizontal edge in a landscape orientation. Where the display assembly 140 includes multiple instances of the interface 160 (e.g., one along a long edge and another along a short edge), the user may select one of the multiple instances of the interface 160 for coupling of the camera assembly 200 (e.g., to have the camera assembly 200 at the top edge of the display assembly 140).

As mentioned, a system can include a camera assembly with a camera such as a web cam that can be utilized for communications. For example, consider a videoconferencing application (e.g., the ZOOM application, the SKYPE application, the GO TO MEETING application, the WEBEX application, etc.) where circuitry of a camera assembly can transmit image data for images captured within the field of view of the camera.

Figure 8:
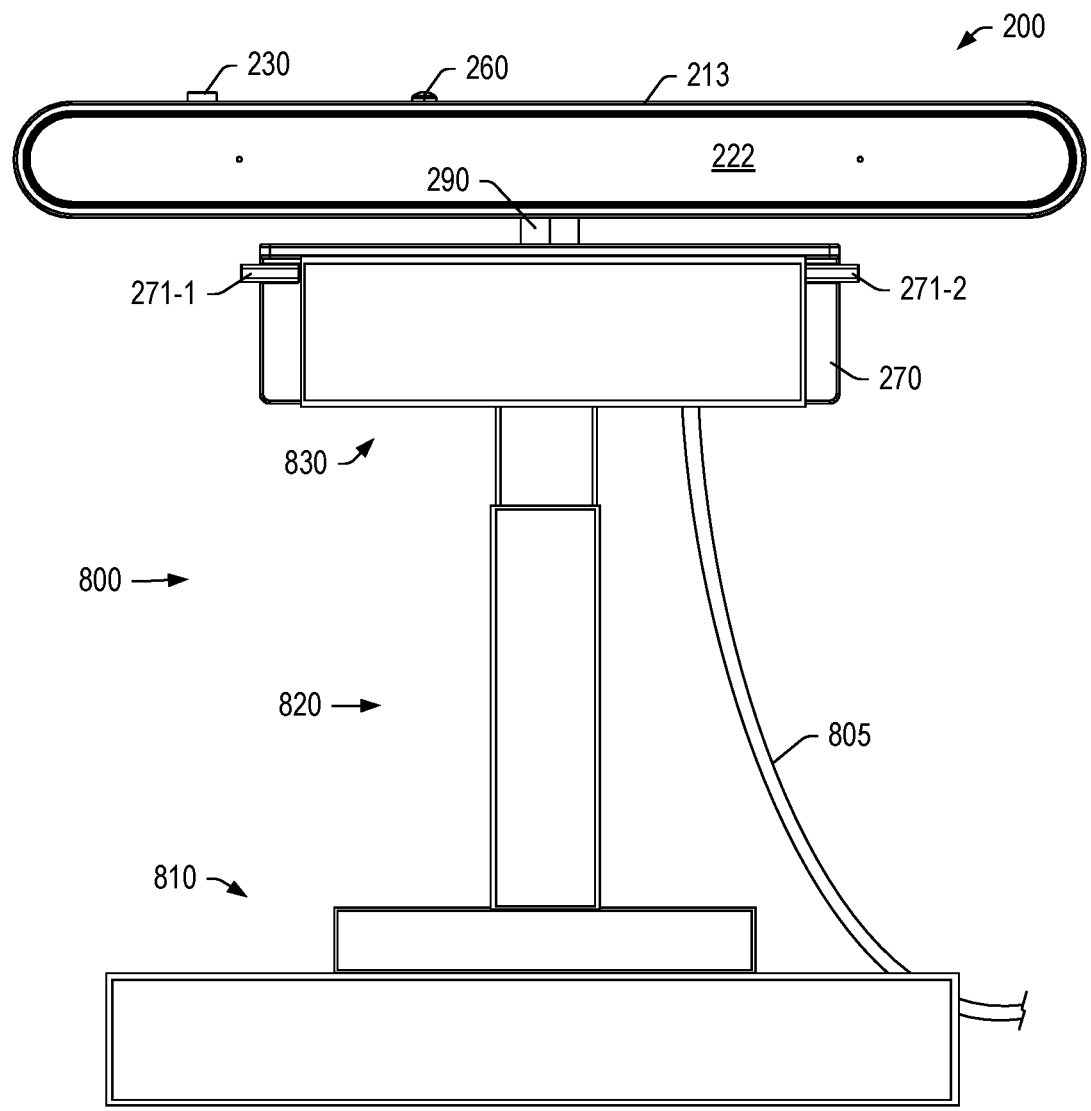
FIG. 8 is a front view of an example of a camera assembly stand with an example of a camera assembly.

FIG. 8 shows an example of a camera assembly stand 800 with the camera assembly 200 mounted on the camera assembly stand 800. As shown, the camera assembly stand 800 can include a base 810, an arm 820 (e.g., a telescoping arm, an articulating arm, etc.), and a coupling 830 that can couple to the tilt mount 270 of the camera assembly 200. As shown, a cable 805 may be included such as, for example, a USB type of cable with appropriate connectors (e.g., at one end or at both ends).

As an example, a system can include a display assembly and a camera assembly where the camera assembly can be paired with the display assembly optionally in a cable-less manner. In such an example, a cable-less approach can help to reduce clutter and help to maintain a "clean" workspace. As explained, one or more magnets may be utilized (e.g., one or more permanent magnets) to couple a camera assembly and a display assembly. A magnetic attraction force may also help to make data and/or power connection robust, for example, through the use of resilient contact (e.g., consider pogo pins, etc.). As explained, various features may provide for anti-theft protection, for example, consider locking pegs (e.g., locking pins, etc.).

As an example, a camera assembly and a display assembly (e.g., a monitor) can be part of a system that can utilize pogo pins for electrical connection for data (e.g., video and/or audio) and power. In such an example, the display assembly can provide power via circuitry and can itself include circuitry for processing and/or transmitting video and/or audio data. As mentioned, one or more magnets may be built into a camera assembly mount that facilitate attachment and/or alignment of the camera assembly to a frame of a display assembly.

As explained, various features may be mechanically controlled via a pin mechanism via a pin such as an end of a paper clip. For example, where a user desires de-coupling of a camera assembly from a display assembly, the user may utilize an end of a paper clip or other tool to cause pegs (e.g., locking pegs, etc.) to retract or otherwise release such that the camera assembly can be de-coupled.

As an example, a system can include a display assembly that includes a display, a display side, a back side and a frame, where the frame includes frame magnetic material and a frame electronic interface; and a camera assembly that includes a camera and a tilt mount, where the tilt mount includes mount magnetic material and a mount electronic interface that electronically mates with the frame electronic interface via a magnetic attraction force. In such an example, the tilt mount can include a swivel mount, for example, consider a swivel mount that includes a ball joint. In such an example, one or more electrical wires (e.g., conductors) can pass through the ball joint.

As an example, a housing of a camera assembly can be rotatable about an axis of a swivel mount. For example, consider a housing that is rotatable about the axis of the swivel mount by at least 180 degrees to transition from facing a display side of a display to facing a back side of the display.

As an example, a tilt mount can include at least one peg (e.g., a locking peg) and a frame can include at least one peg receptacle (e.g., a locking peg receptacle). As an example, a tilt mount can include an L-shaped coupling.

As an example, a frame electronic interface can include a serial bus interface and a mount electronic interface can include a serial bus interface.

As an example, at least one of a frame electronic interface and a mount electronic interface can include spring loaded electrical contacts. For example, consider an approach where magnetic attraction force compresses one or more springs of the spring loaded electrical contacts.

As an example, a camera assembly can include a status light. For example, consider a status light that includes a top side housing portion and a back side housing portion.

As an example, a camera assembly can be externally cable-less. For example, consider a single electrical interface that is a mount electrical interface.

As an example, a camera assembly can include at least one microphone. For example, a camera assembly can include a microphone array with at least two microphones.

As an example, a display assembly can be a bezel-less display assembly.

As an example, a display assembly can house a processor and memory accessible to the processor. In such an example, a system that includes the display assembly can include a keyboard with depressible, mechanical keys. As an example, a display assembly may be an all-in-one computing device.

As an example, a system can include a stand such as a stand that is part of a display assembly or otherwise operatively coupled to a display assembly. As an example, a stand can include a keyboard platform.

As an example, a frame electronic interface can be a first frame electronic interface of a frame of a display assembly and the frame of the display assembly can include a second frame electronic interface. In such an example, the frame can have a rectangular form factor that includes a long edge and a short edge, where the first frame electronic interface is disposed on the long edge and where the second frame electronic interface is disposed on the short edge. In such an example, the display assembly may include features for rotation of the frame to a portrait orientation and to a landscape orientation.

As an example, a camera assembly can include a housing; a camera disposed in the housing; and a tilt mount, where the tilt mount includes mount magnetic material and a mount electronic interface. In such an example, the tilt mount can be a swivel mount. For example, consider a ball joint that can provide for movement in various degrees of freedom. As an example, a tilt mount may provide for movement such as rotational movement to tilt front to back about an axis defined by a pin joint (e.g., a pin and barrel hinge type of joint, an axle and bore joint, etc.).

As an example, a tilt mount can include an L-shaped coupling. For example, consider an L-shaped coupling that can couple to an edge of a frame of a display assembly.

As an example, a mount electronic interface can be a serial bus interface that provides for transmission of power and/or data. As an example, a mount electronic interface can include spring loaded electrical contacts.

As an example, a camera assembly can include a status light. For example, consider a status light that includes a top side housing portion and a back side housing portion.

As an example, a camera assembly can be externally cable-less. For example, such a camera assembly can be mounted to a display assembly using a mount that includes an integral electronic interface. As explained, such a mount can include one or more permanent magnets and may include one or more spring-loaded electrical contacts (e.g., pogo pins, etc.). As an example, a kit may include a camera assembly and a stand where the stand may include a cable or cable connector (e.g., for a USB cable, etc.). In such an example, the camera assembly can be utilized without a cable or with a cable via the stand.

The term "circuit" or "circuitry" is used in the summary, description, and/or claims. As is well known in the art, the term "circuitry" includes all levels of available integration, e.g., from discrete logic circuits to the highest level of circuit integration such as VLSI, and includes programmable logic components programmed to perform the functions of an embodiment as well as general-purpose or special-purpose processors programmed with instructions to perform those functions. Such circuitry may optionally rely on one or more computer-readable media that includes computer-executable instructions. As described herein, a computer-readable medium may be a storage device (e.g., a memory card, a storage disk, etc.) and referred to as a computer-readable storage medium.

Figure 9:
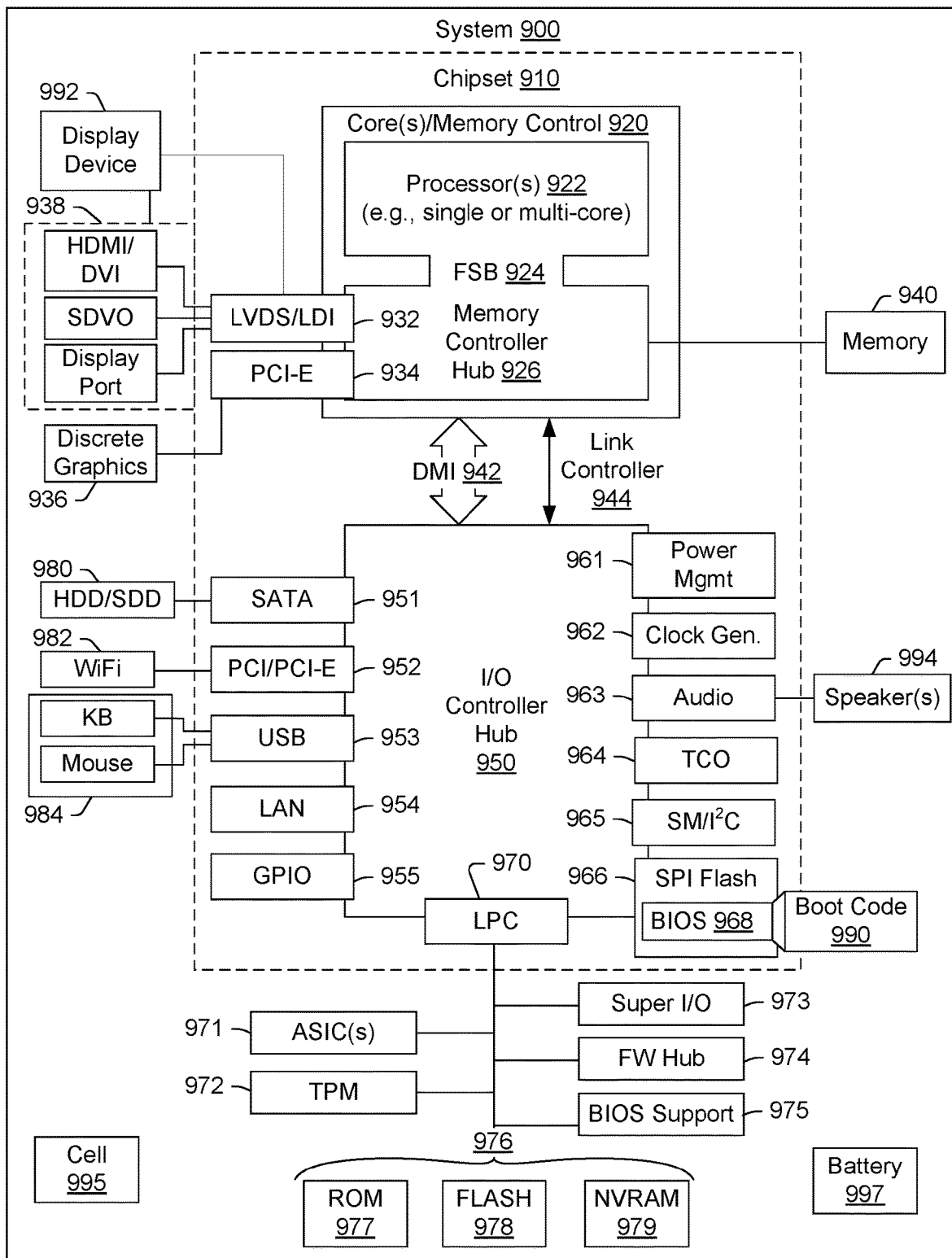
FIG. 9 is a diagram of an example of a system.

While various examples of circuits or circuitry have been discussed, FIG. 9 depicts a block diagram of an illustrative computer system 900. The system 900 may be a computer system sold by Lenovo (US) Inc. of Morrisville, NC (e.g., a THINKSTATION® system, etc.); however, as apparent from the description herein, a satellite, a base, a display, a computing device, a server or other machine may include one or more features and/or other features of the system 900.

As an example, a monitor or display may include features such as one or more of the features included in one of the LENOVO® IDEACENTRE® or THINKCENTRE® "all-in-one" (AIO) computing devices (e.g., sold by Lenovo (US) Inc. of Morrisville, NC). For example, the LENOVO® IDEACENTRE® A720 computing device includes an Intel® Core i7 processor, a 27 inch frameless multi-touch display (e.g., for HD resolution of 1920×1080), a NVIDIA® GeForce® GT 630M 2 GB graphics card, 8 GB DDR3 memory, a hard drive, a DVD reader/writer, integrated Bluetooth® and 802.11b/g/n Wi-Fi®, USB connectors, a 6-in-1 card reader, a webcam, HDMI in/out, speakers, and a TV tuner.

As shown in FIG. 9, the system 900 includes a so-called chipset 910. A chipset refers to a group of integrated circuits, or chips, that are designed to work together. Chipsets are usually marketed as a single product (e.g., consider chipsets marketed under the brands INTEL®, AMD®, etc.).

In the example of FIG. 9, the chipset 910 has a particular architecture, which may vary to some extent depending on brand or manufacturer. The architecture of the chipset 910 includes a core and memory control group 920 and an I/O controller hub 950 that exchange information (e.g., data, signals, commands, etc.) via, for example, a direct management interface or direct media interface (DMI) 942 or a link controller 944. In the example of FIG. 9, the DMI 942 is a chip-to-chip interface (sometimes referred to as being a link between a "northbridge" and a "southbridge").

The core and memory control group 920 include one or more processors 922 (e.g., single core or multi-core) and a memory controller hub 926 that exchange information via a front side bus (FSB) 924. As described herein, various components of the core and memory control group 920 may be integrated onto a single processor die, for example, to make a chip that supplants the conventional "northbridge" style architecture.

The memory controller hub 926 interfaces with memory 940. For example, the memory controller hub 926 may provide support for DDR SDRAM memory (e.g., DDR, DDR2, DDR3, etc.). In general, the memory 940 is a type of random-access memory (RAM). It is often referred to as "system memory".

The memory controller hub 926 further includes a low-voltage differential signaling interface (LVDS) 932. The LVDS 932 may be a so-called LVDS Display Interface (LDI) for support of a display device 992 (e.g., a CRT, a flat panel, a projector, etc.). A block 938 includes some examples of technologies that may be supported via the LVDS interface 932 (e.g., serial digital video, HDMI/DVI, display port). The memory controller hub 926 also includes one or more PCI-express interfaces (PCI-E) 934, for example, for support of discrete graphics 936. Discrete graphics using a PCI-E interface has become an alternative approach to an accelerated graphics port (AGP). For example, the memory controller hub 926 may include a 16-lane (×16) PCI-E port for an external PCI-E-based graphics card. A system may include AGP or PCI-E for support of graphics. As described herein, a display may be a sensor display (e.g., configured for receipt of input using a stylus, a finger, etc.). As described herein, a sensor display may rely on resistive sensing, optical sensing, or other type of sensing.

The I/O hub controller 950 includes a variety of interfaces. The example of FIG. 9 includes a SATA interface 951, one or more PCI-E interfaces 952 (optionally one or more legacy PCI interfaces), one or more USB interfaces 953, a LAN interface 954 (more generally a network interface), a general purpose I/O interface (GPIO) 955, a low-pin count (LPC) interface 970, a power management interface 961, a clock generator interface 962, an audio interface 963 (e.g., for speakers 994), a total cost of operation (TCO) interface 964, a system management bus interface (e.g., a multi-master serial computer bus interface) 965, and a serial peripheral flash memory/controller interface (SPI Flash) 966, which, in the example of FIG. 9, includes BIOS 968 and boot code 990. With respect to network connections, the I/O hub controller 950 may include integrated gigabit Ethernet controller lines multiplexed with a PCI-E interface port. Other network features may operate independent of a PCI-E interface.

The interfaces of the I/O hub controller 950 provide for communication with various devices, networks, etc. For example, the SATA interface 951 provides for reading, writing or reading and writing information on one or more drives 980 such as HDDs, SDDs or a combination thereof. The I/O hub controller 950 may also include an advanced host controller interface (AHCI) to support one or more drives 980. The PCI-E interface 952 allows for wireless connections 982 to devices, networks, etc. The USB interface 953 provides for input devices 984 such as keyboards (KB), one or more optical sensors, mice and various other devices (e.g., microphones, cameras, phones, storage, media players, etc.). On or more other types of sensors may optionally rely on the USB interface 953 or another interface (e.g., $I^2C$, etc.). As to microphones, the system 900 of FIG. 9 may include hardware (e.g., audio card) appropriately configured for receipt of sound (e.g., user voice, ambient sound, etc.).

In the example of FIG. 9, the LPC interface 970 provides for use of one or more ASICs 971, a trusted platform module (TPM) 972, a super I/O 973, a firmware hub 974, BIOS support 975 as well as various types of memory 976 such as ROM 977, Flash 978, and non-volatile RAM (NVRAM) 979. With respect to the TPM 972, this module may be in the form of a chip that can be used to authenticate software and hardware devices. For example, a TPM may be capable of performing platform authentication and may be used to verify that a system seeking access is the expected system.

The system 900, upon power on, may be configured to execute boot code 990 for the BIOS 968, as stored within the SPI Flash 966, and thereafter processes data under the control of one or more operating systems and application software (e.g., stored in system memory 940). An operating system may be stored in any of a variety of locations and accessed, for example, according to instructions of the BIOS 968. Again, as described herein, a satellite, a base, a server or other machine may include fewer or more features than shown in the system 900 of FIG. 9. Further, the system 900 of FIG. 9 is shown as optionally include cell phone circuitry 995, which may include GSM, CDMA, etc., types of circuitry configured for coordinated operation with one or more of the other features of the system 900. As shown, the system 900 may include one or more batteries 997 and, for example, battery management circuitry.

Although examples of methods, devices, systems, etc., have been described in language specific to structural features and/or methodological acts, it is to be understood that the subject matter defined in the appended claims is not necessarily limited to the specific features or acts described. Rather, the specific features and acts are disclosed as examples of forms of implementing the claimed methods, devices, systems, etc.

What is claimed is:

1. A system comprising:
a display assembly that comprises a display, a display side, a back side and a frame, wherein the frame comprises frame magnetic material and a frame electronic interface; and
a camera assembly that comprises a housing, a camera, a status light, and a tilt mount, wherein the tilt mount comprises mount magnetic material and a mount electronic interface that electronically mates with the frame electronic interface via a magnetic attraction force, and wherein the tilt mount locks to the frame via a tool-releasable anti-theft mechanism that comprises at least one retractable locking peg and at least one locking peg receptacle.

2. The system of claim 1, wherein the tilt mount comprises a swivel mount.

3. The system of claim 2, wherein the housing is rotatable about an axis of the swivel mount by at least 180 degrees to transition from facing the display side of the display to facing the back side of the display.

4. The system of claim 1, wherein the tilt mount comprises the at least one retractable locking peg and wherein the frame comprises the at least one locking peg receptacle.

5. The system of claim 1, wherein the frame electronic interface comprises a serial bus interface and wherein the mount electronic interface comprises a serial bus interface.

6. The system of claim 1, wherein at least one of the frame electronic interface and the mount electronic interface comprises spring loaded electrical contacts and wherein the magnetic attraction force compresses one or more springs of the spring loaded electrical contacts.

7. The system of claim 1, wherein the status light comprises a back side housing portion.

8. The system of claim 1, wherein the camera assembly is externally cable-less.

9. The system of claim 1, wherein the display is bezel-less.

10. The system of claim 1, wherein the display assembly houses a processor and memory accessible to the processor.

11. The system of claim 1, wherein the display assembly comprises a stand.

12. The system of claim 1, where the frame electronic interface is a first frame electronic interface and comprising a second frame electronic interface, wherein the frame comprises a rectangular form factor that comprises a long edge and a short edge, wherein the first frame electronic interface is disposed on the long edge and wherein the second frame electronic interface is disposed on the short edge.

13. A camera assembly comprising:
a housing;
a camera disposed in the housing;
a status light;
a tilt mount, wherein the tilt mount comprises mount magnetic material and a mount electronic interface;
a microphone; and
a mechanical shutter, wherein the mechanical shutter comprises a front panel with an opening and a top panel with an extension that extends through a slot in a top surface of the housing, wherein, upon application of force to the extension, the mechanical shutter is movable between an open position and a closed position, wherein, in the closed position, an aperture of the camera is covered by a portion of the front panel.

14. The camera assembly of claim 13, wherein the tilt mount comprises a swivel mount.

15. The camera assembly of claim 13, wherein the tilt mount comprises an L-shaped coupling.

16. The camera assembly of claim 13, wherein the mount electronic interface comprises a serial bus interface.

17. The camera assembly of claim 13, wherein the mount electronic interface comprises spring loaded electrical contacts.

18. The camera assembly of claim 13 wherein the status light comprises a top side housing portion and a back side housing portion.

19. The camera assembly of claim 13, wherein the camera assembly is externally cable-less.

20. A system comprising:
a display assembly that comprises a display, a display side, a back side and a frame, wherein the frame comprises frame magnetic material and a frame electronic interface; and
a camera assembly that comprises a housing, a camera, a status light, a microphone, a mechanical shutter, and a tilt mount, wherein the tilt mount comprises mount magnetic material and a mount electronic interface that electronically mates with the frame electronic interface via a magnetic attraction force, and wherein the mechanical shutter comprises a front panel with an opening and a top panel with an extension that extends through a slot in a top surface of the housing, wherein, upon application of force to the extension, the mechanical shutter is movable between an open position and a closed position, wherein, in the closed position, an aperture of the camera is covered by a portion of the front panel.

* * * * *